United States Patent
Choi et al.

(10) Patent No.: US 9,823,531 B2
(45) Date of Patent: Nov. 21, 2017

(54) THIN FILM TRANSISTOR ARRAY PANEL, MANUFACTURING METHOD THEREOF, AND DISPLAY DEVICE INCLUDING THE THIN FILM TRANSISTOR ARRAY PANEL

(71) Applicant: Samsung Display Co., Ltd., Yongin (KR)

(72) Inventors: Tae-Young Choi, Seoul (KR); Bo Sung Kim, Seoul (KR); Jae Woo Park, Seongnam-si (KR); Hee Jun Byeon, Suwon-si (KR); Young-Wook Lee, Hwaseong-si (KR); Moon-Keun Choi, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 115 days.

(21) Appl. No.: 14/277,526

(22) Filed: May 14, 2014

(65) Prior Publication Data

US 2015/0049276 A1 Feb. 19, 2015

(30) Foreign Application Priority Data

Aug. 14, 2013 (KR) .................. 10-2013-0096654

(51) Int. Cl.
  *G02F 1/1362* (2006.01)
  *H01L 27/12* (2006.01)
  *H01L 27/02* (2006.01)

(52) U.S. Cl.
  CPC .. *G02F 1/136286* (2013.01); *G02F 1/136204* (2013.01); *H01L 27/0288* (2013.01); *H01L 27/124* (2013.01)

(58) Field of Classification Search
  CPC .................................. G02F 1/136286
  See application file for complete search history.

(56) References Cited

U.S. PATENT DOCUMENTS

| | | | | |
|---|---|---|---|---|
| 6,128,051 A | * | 10/2000 | Kim | ................. G02F 1/136204 349/192 |
| 8,154,674 B2 | | 4/2012 | Chung et al. | |
| 2005/0056833 A1 | * | 3/2005 | Kim | ...................... G02F 1/1309 257/48 |
| 2008/0204618 A1 | * | 8/2008 | Jung | ................... G02F 1/13452 349/40 |
| 2009/0244420 A1 | * | 10/2009 | Chung | ................. G02F 1/1309 349/40 |
| 2012/0026076 A1 | * | 2/2012 | Huang | .............. G02F 1/136259 345/92 |
| 2012/0326148 A1 | | 12/2012 | Ko et al. | |

(Continued)

FOREIGN PATENT DOCUMENTS

| KR | 10-2006-0077853 | 7/2006 |
|---|---|---|
| KR | 10-0924140 | 10/2009 |

(Continued)

*Primary Examiner* — Edmond Lau
(74) *Attorney, Agent, or Firm* — H.C. Park & Associates, PLC

(57) ABSTRACT

A thin film transistor array panel includes: gate lines; data lines insulated from and crossing the gate lines; and shorting bars disposed outside of a display area in which the gate lines cross the data lines. The shorting bars overlap portions of the data lines disposed outside of the display area. The shorting bar includes a semiconductor material.

11 Claims, 19 Drawing Sheets

(56) References Cited

U.S. PATENT DOCUMENTS

| | | | |
|---|---|---|---|
| 2013/0043474 A1* | 2/2013 | Tang | H01L 27/1288 257/59 |
| 2013/0057799 A1 | 3/2013 | Zhuang | |
| 2013/0077034 A1 | 3/2013 | Jung et al. | |
| 2013/0194224 A1* | 8/2013 | Lai | G06F 3/0412 345/174 |
| 2014/0168559 A1* | 6/2014 | Zhu | G02F 1/136204 349/43 |

FOREIGN PATENT DOCUMENTS

| | | |
|---|---|---|
| KR | 10-2009-0126052 | 12/2009 |
| KR | 10-0947448 | 3/2010 |
| KR | 10-1200258 | 11/2012 |

\* cited by examiner

THIN FILM TRANSISTOR ARRAY PANEL, MANUFACTURING METHOD THEREOF, AND DISPLAY DEVICE INCLUDING THE THIN FILM TRANSISTOR ARRAY PANEL

CROSS-REFERENCE TO RELATED APPLICATION

This application claims priority from and the benefit of Korean Patent Application No. 10-2013-0096654, filed on Aug. 14, 2013, which is incorporated by reference for all purposes as if set forth herein.

BACKGROUND

Field

Exemplary embodiments relate to a thin film transistor array panel, a manufacturing method thereof, and a display device including the thin film transistor array panel.

Discussion

Conventional display devices include, for example, liquid crystal displays, organic light emitting displays, plasma displays, field emission displays, electrophoretic displays, electrowetting displays, and the like. These displays typically include a display panel and a driver configured to drive the display panel. The display panel may include a thin film transistor array panel on which a thin film transistor is formed and an upper display panel. The display panel is usually divided into a display area and a peripheral area surrounding the display area. The driver and other wires are typically formed in the peripheral area.

Thin film transistor array panels have conventionally been formed using several etching processes. When the widths of wires, which are usually designed to be the same as each other, are formed with different widths due to, for instance, processing variations in the etching processes, issues arise affecting display quality. For example, when line widths of data lines are different from each other, an image displayed by pixels connected with the data lines may be displayed darker or lighter than intended.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments provide a thin film transistor array panel configured to prevent (or otherwise reduce) defects caused, at least in part, by static electricity buildup and/or discharge during manufacture, and a manufacturing method thereof.

Exemplary embodiments provide a display device including the thin film transistor array panel.

Additional aspects will be set forth in the detailed description which follows, and, in part, will be apparent from the disclosure, or may be learned by practice of the inventive concept.

According to exemplary embodiments, a thin film transistor array panel includes: gate lines; data lines insulated from and crossing the gate lines; and shorting bars disposed outside of a display area in which the gate lines cross the data lines. The shorting bars respectively overlap portions of the data lines disposed outside the display area. The shorting bars include a semiconductor material.

According to exemplary embodiments, a method of manufacturing a thin film transistor array panel, includes: forming gate lines on a substrate; forming a gate insulating layer on the gate lines; forming a semiconductor material on the gate insulating layer; forming a conductive material on the semiconductor material; forming photoresist on the conductive material; and patterning the photoresist. The patterned photoresist includes: a first region exposing a portion of the conductive material; a second region of a first thickness; and a second region of a second thickness different than the first thickness. The method further includes: forming data lines, transistor electrodes, a semiconductor layer, and a shorting bar connected to the data lines by etching the conductive material and the semiconductor material using the patterned photoresist as a mask; and forming shorting bar portions by etching the shorting bar.

According to exemplary embodiments, a display device includes: a gate line; a data line insulated from and crossing the gate line, the data line comprising a first end and a second end, the first end comprising a data pad and the second end being disposed on an island of semiconductor material; and a pixel connected to the gate line and the data line, the pixel being configured to display an image in response to signals received via the gate line and the data line.

According to exemplary embodiments, a shorting bar may be formed in a peripheral area of a display device using a semiconductor layer connected to wires. In this manner, when static electricity is generated during a process of manufacturing the wires, the static electricity may be distributed to the shorting bar, and, thereby, distributed to a plurality of the wires. The shorting bar may be disconnected after the wires are formed so that the static electricity may be removed from each wire and each wire may transfer an independent signal. Further, exemplary embodiments enable wires of a thin film transistor array panel to be formed with substantially uniform widths to prevent (or at least reduce) issues associated with luminance deterioration that may otherwise occur when wires are formed with different widths.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

Figure 1:
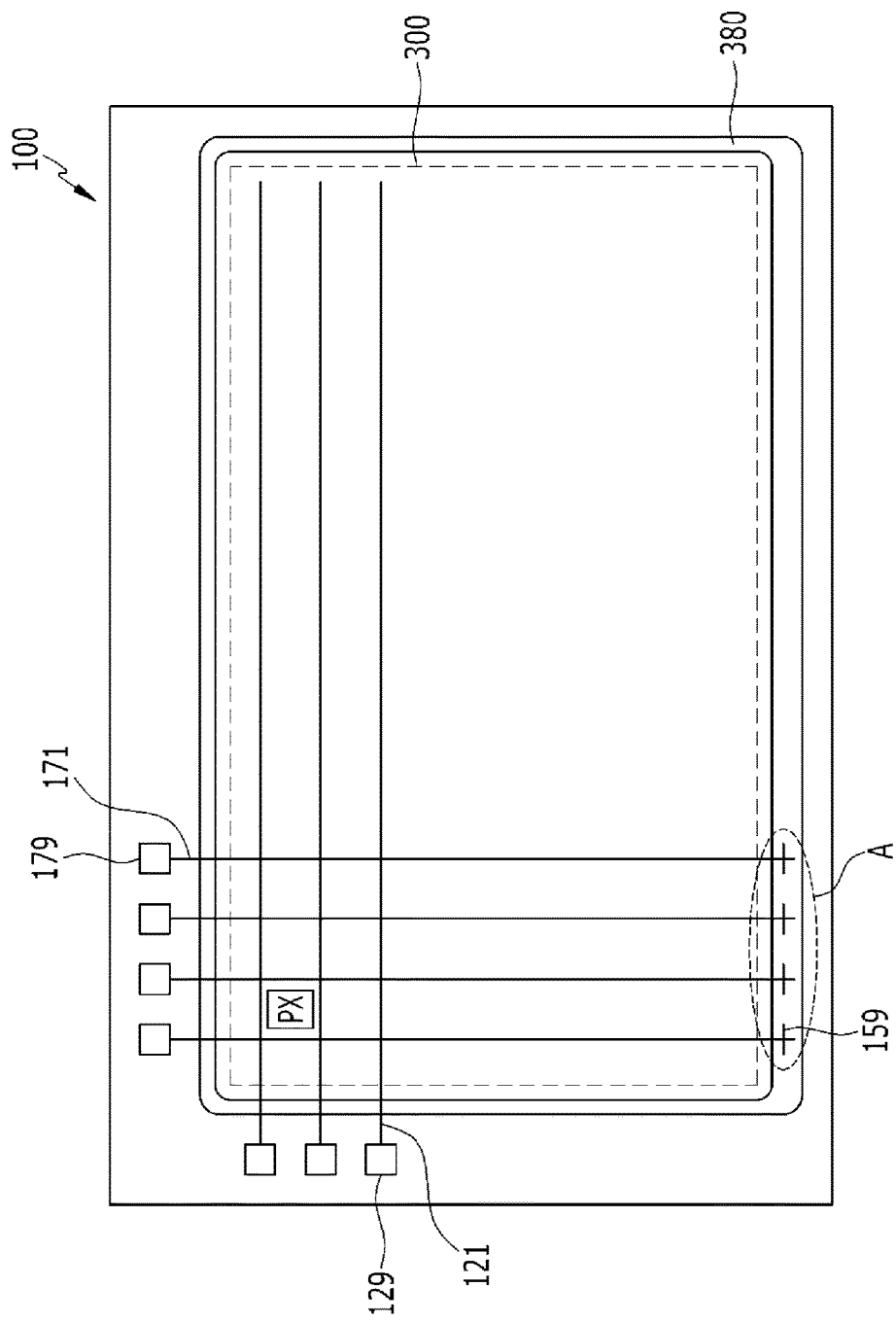
FIG. 1 is a layout view of a thin film transistor array panel, according to exemplary embodiments.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

FIG. 1 is a layout view of a thin film transistor array panel, according to exemplary embodiments.

According to exemplary embodiments, a thin film transistor array panel 100 may include a display area 300 including pixels PX and a peripheral area outside (e.g., surrounding) the display area 300. An upper display panel (not illustrated) may be disposed on an upper side of the thin film transistor array panel 100 to form a display panel. The display panel may be utilized in association with, for example, a liquid crystal display panel, an organic light emitting display panel, a plasma display panel, a field emission display panel, an electrophoretic display panel, an electrowetting display panel, or the like.

Gate lines 121 extended in a first (e.g., horizontal) direction may be formed on the thin film transistor array panel 100. Gate pads 129 may be formed at ends of one side of the gate lines 121. The gate pads 129 may be exposed to the outside of a seal member 380. Data lines 171 extended in a second (e.g., vertical) direction may also be formed on the thin film transistor array panel 100. The data lines 171 may be insulated from and cross the gate lines 121. The data lines 171 and the gate lines 121 may be electrically connected to pixels PX. That is, each pixel PX may be connected to at least one gate line 121 and at least one data line 171. It is noted that depending on the implementation, the pixels PX may be defined by respective divisions formed by the gate lines 121 crossing the data lines 171. Data pads 179 may be formed at ends of one side of the data lines 171. The data pads 179 may be exposed to the outside of the seal member 380.

As seen in FIG. 1, a cut shorting bar 159 may be positioned at the other sides of respective the data lines 171. That is, for each data line 171, a first end may be connected to a data pad 179 and a second end may be connected to a cut shorting bar 159. The cut shorting bar 159 may extend in the first direction, and, thereby, cross and overlap the data line 171. It is noted that the cut shorting bar 159 is not insulated from the data line 171. The cutting shorting bar 159 may be formed of any suitable semiconductor material. Depending on the configuration, the cut shorting bar 159 may or may not be exposed in a direction (e.g., horizontal direction) vertical to the data line 171.

According to exemplary embodiments, the data line 171 and the cut shorting bar 159 may be covered by a passivation layer (not shown), as will be described in more detail with reference to FIG. 4. To this end, a contact hole (not illustrate) through which a lower layer (not shown) may be exposed may be formed in the passivation layer, and a cut portion of the cut shorting bar 159 may correspond to the contact hole, or may be cut by the contact hole. This will be described later in more detail.

The seal member 380 may surround a peripheral area of the display area 300, and may overlap the cut shorting bar 159. When the seal member 380 overlaps the cut shorting bar 159, a size of the peripheral area may be decreased. It is noted, however, that the seal member 380 may not entirely cover the peripheral area.

A structure of the cut shorting bar 159 will be described in more detail with reference to FIGS. 2 and 3.

Figure 2:
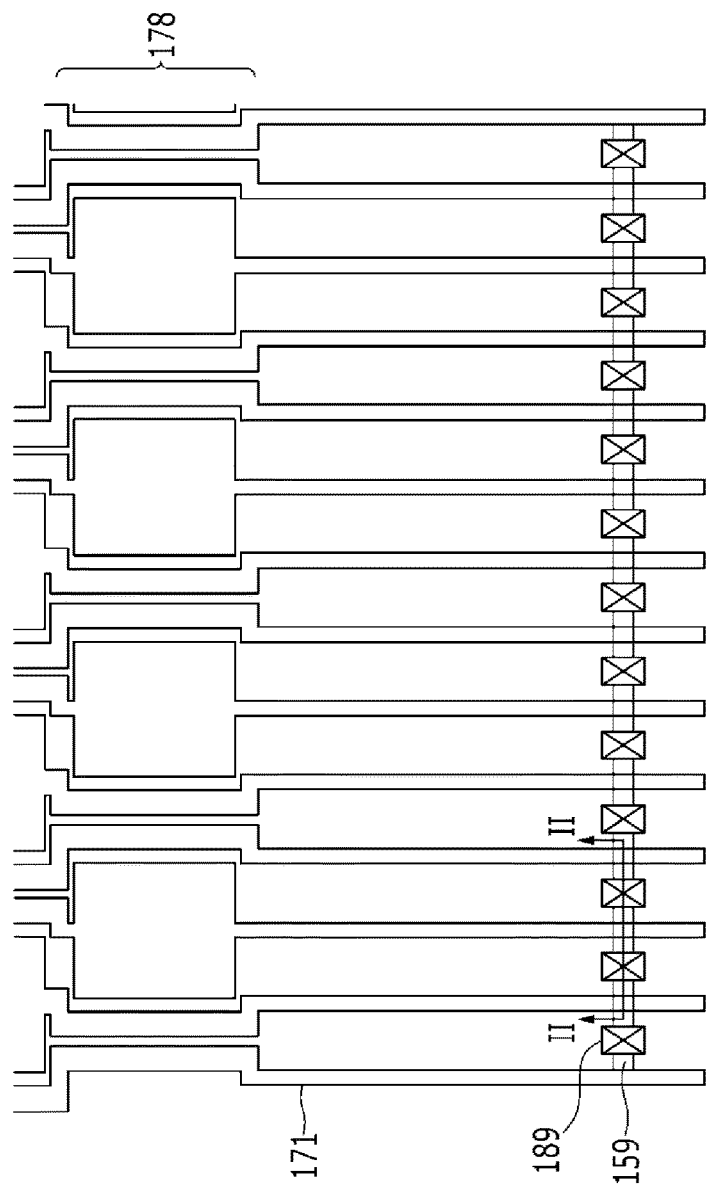
FIG. 2 is an enlarged layout view of a shorting bar portion of the thin film transistor array panel of FIG. 1, according to exemplary embodiments.

FIG. 2 is an enlarged layout view of a shorting bar portion of the thin film transistor array panel of FIG. 1, according to exemplary embodiments. FIG. 3 is a cross-sectional view of the shorting bar portion of FIG. 2 taken along sectional line II-II, according to exemplary embodiments. It is noted that FIG. 2 corresponds to region A of FIG. 1.

As illustrated in FIG. 2, the cut shorting bar 159 may be elongated in the first direction at an end of the data line 171, such as at an end of a lower side of the data line 171. A longitudinal direction of the cut shorting bar 159 may be perpendicular (or substantially perpendicular) to the direction in which the data line 171 extends. It is contemplated, however, that the longitudinal direction of the cut shorting bar 159 may not be perpendicular (or substantially perpendicular) to the direction in which the data line 171 extends. For example, that cut shorting bar 159 may longitudinally extend parallel (or substantially parallel) to the longitudinal extension of the data line 171.

According to exemplary embodiments, the cut shorting bar 159 may be formed of a semiconductor that is in contact with a lower portion of the data line 171 and is formed in a perpendicular (or substantially perpendicular) direction to the longitudinal direction that the data lines 171 extends. An ohmic contact layer (not shown) may be formed between the data line 171 and the shorting bar 159. The shorting bar 159 may be formed of any suitable semiconductor material, such as, for example, an oxide semiconductor material, e.g., amorphous silicon, indium gallium zinc oxide (IGZO), etc.

When the shorting bar 159 is cut, a high voltage, such as static electricity, may be generated in the data line 171. The high voltage may also be transferred to other data lines 171 through the shorting bar 159 formed of the semiconductor material, such that static electricity may be distributed across a number of data lines 171 when the data lines 171 are being formed, as will become more apparent in the description accompanying FIGS. 11-18.

In exemplary embodiments, the cut shorting bar 159 may be cut by the formation of contact holes (e.g., contact hole 189) arranged in the horizontal direction, e.g., disposed between adjacent data lines 171. That is, a border surface of the contact hole 189 may correspond to an end of the cut shorting bar 159 when viewed in a plan view.

An open/short (OS) pad 178 may be formed at an inner side of the cut shorting bar 159 in the data line 171. The OS pad 178 may be utilized to apply a voltage to a corresponding pad, such as after a process of manufacturing the data line 171 to check whether there is a short-circuit or disconnection in the adjacent data line 171. This may be referred to as an OS test. When the OS test is performed via the OS pad 178, the shorting bar 159 may be disconnected and may be considered a cut shorting bar 159.

Figure 3:
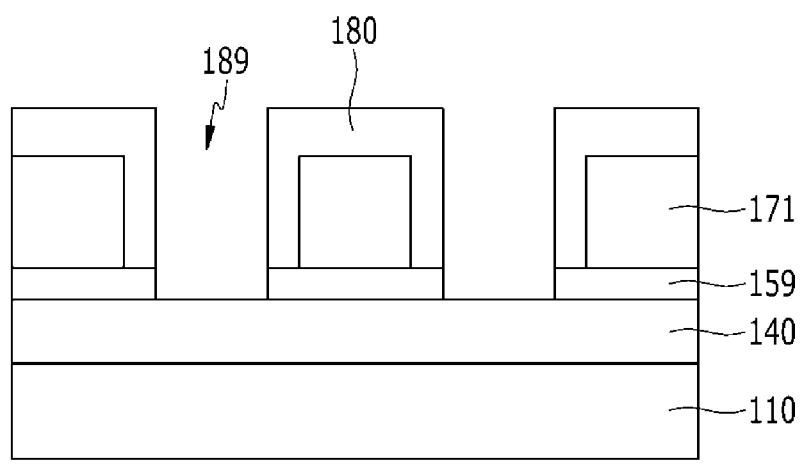
FIG. 3 is a cross-sectional view of the shorting bar portion of FIG. 2 taken along sectional line II-II, according to exemplary embodiments.

Referring to the cross-sectional view of FIG. 3, a gate insulating layer 140 may be disposed on an insulating substrate 110. The cut shorting bars 159 may be disposed on the gate insulating layer 140, and the data lines 171 may be respectively disposed on the cut shorting bars 159. The data lines 171 and the shorting bars 159 may be covered by passivation layer 180, or, in other words, the passivation layer 180 may be disposed on the data lines 171 and the shorting bars 159. The contact holes 189 may be formed in the passivation layer 180. Each contact hole 189 is positioned so that a cut surface of the shorting bar 159 is exposed.

A method of manufacturing the cut shorting bars 159 will be described with reference to FIGS. 4 to 6.

Figure 4:
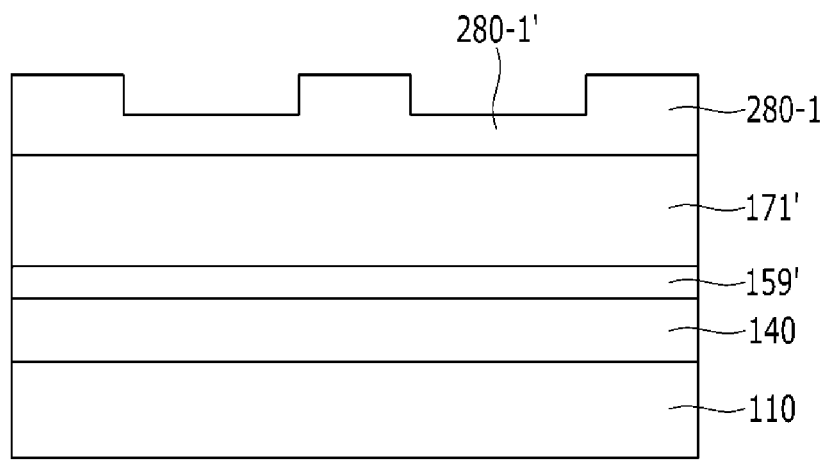
FIGS. 4 to 6 are respective cross-sectional views of a thin film transistor array panel at various stages of manufacture, according to exemplary embodiments.
Figure 5:
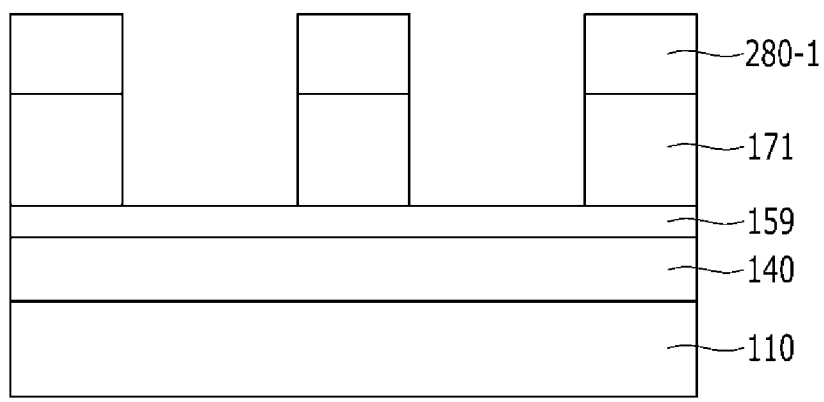
Figure 6:
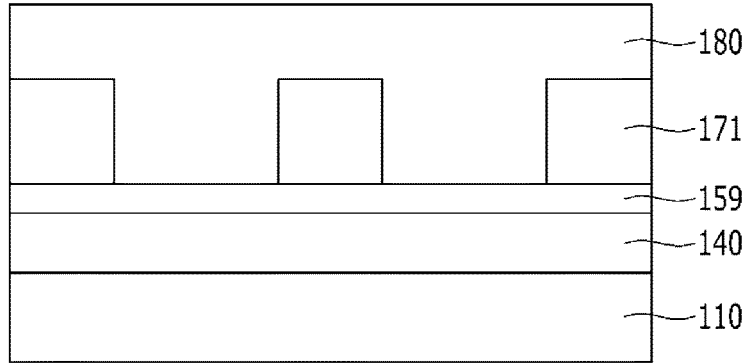

FIGS. 4 to 6 are respective cross-sectional views of a thin film transistor array panel at various stages of manufacture, according to exemplary embodiments.

The gate lines (not illustrated) are formed on the insulating substrate 110. The insulating substrate 110 including the gate lines 121 is covered with the gate insulating layer 140, or, in other words, the gate insulating layer 140 is formed on the gate lines 121 and the insulating substrate 110. A semiconductor material 159' and a material 171' for the data lines 171 are formed on the gate insulating layer 140. That is, the semiconductor material 159' may be formed on the gate insulating layer 140 and the material 171' may be formed on the semiconductor material 159'. As illustrated, the data line 171 is formed in a single layer, and, as such, the material 171' for the data lines 171 is formed as one layer. It is contemplated, however, that the data lines 171 may be formed as multilayer structures. As such, the material 171' for the data lines 171 may be formed as one or more layers.

A photoresist may be formed on the material 171' for the data line. The photoresist may be exposed using a mask (not illustrated) to form photoresist patterns 280-1 and 280-1'. It is noted that the photoresist (or the photoresist patterns 280-1 and 280-1') may be removed in one or more portions (not shown) of the structure formed on the insulating substrate 110. An example of this is described in more detail in association with FIG. 13. The region in which the photoresist is formed includes two regions 280-1 and 280-1' having different heights from each other as illustrated in FIG. 4. The first region 280-1' is a region having a relatively smaller height, and the second region 280-1 is a region having a relatively larger height. It is noted that the region of the mask forming the first region 280-1' may include a slit pattern, a transflective pattern, or any other suitable pattern to enable formation of the smaller height versus the larger height.

An etching process may be performed as illustrated in FIG. 5. In the region in which the photoresist is not formed, both the material 171' for the data line and the semiconductor material 159' are etched. In this manner, respective portions of the gate insulating layer 140 may be exposed. In the region, such as the first region 280-1', in which the photoresist is formed thinner, the material 171' for the data line is etched, but the semiconductor material 159' is not etched. In the region, such as the second region 280-1, in which the photoresist is formed thicker, the material 171' for the data line is not etched, and at least some of the photoresist 280-1 may remain after the etching process. The pattern of the data lines 171 may be complete upon completion of the aforementioned etching process. The semiconductor material 159' may also be etched to complete formation of the shorting bar 159. In this manner, the semiconductor material 159' may be disposed under the data line 171, and the semiconductor material 159' formed in the region in which the data line 171 is not disposed may correspond to the shorting bar 159 or a channel of the thin film transistor.

The photoresist 280-1 may be removed as illustrated in FIG. 6. The passivation layer 180 may be formed on the data lines 171 and the shorting bar 159. The contact holes 189 may be formed in the passivation layer 180 as illustrated in FIG. 3. In exemplary embodiments, the contact holes 189 may be formed by etching the passivation layer 180 and simultaneously cutting the shorting bar 159 to form the cut shorting bar 159. Since the cut shorting bar 159 is cut when the contact hole 189 is etched, a portion of the internal surface of the contact hole 189 may correspond to an exposed surface (e.g., the cut surface) of the shorting bar 159.

Figure 7:
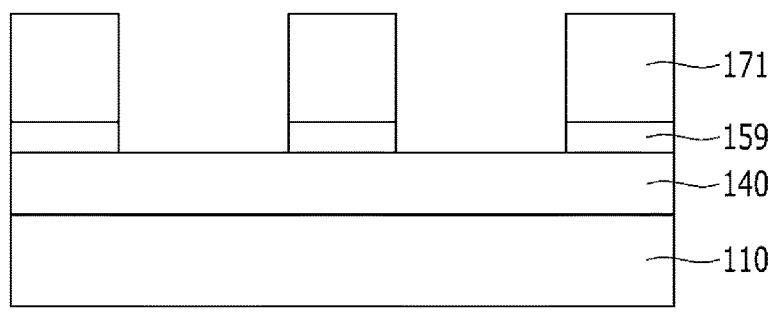
FIGS. 7 and 8 are respective cross-sectional views of a thin film transistor array panel at various stages of manufacture, according to exemplary embodiments.
Figure 8:
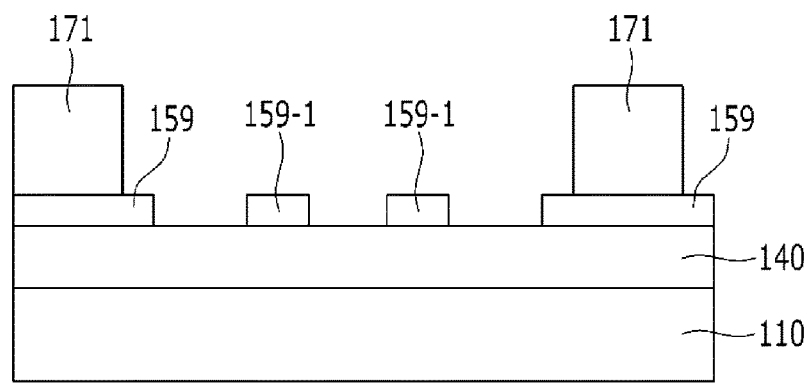

It is contemplated, however, that the cut shorting bar 159 may be configured in any suitable manner, such as the manner described in association with FIGS. 7 and 8.

FIGS. 7 and 8 are respective cross-sectional views of a thin film transistor array panel at various stages of manufacture, according to exemplary embodiments.

The cut shorting bar 159, as illustrated in FIG. 7, has a structure in which a side surface of the data line 171 corresponds to a cut surface of the shorting bar 159. In this manner, the contact hole 189 of the passivation layer 180 covering the data line 171 is cut to correspond to the width of the data line 171, or the shorting bar 159 is cut to correspond to the width of the data line 171 through a separate etching process. It is noted, however, that the lateral ends of the shorting bar 159 may be positioned inwardly from the lateral ends of the data line 171 due to an undercut in the etching process of cutting the shorting bar 159.

FIG. 8 illustrates a structure of cutting the shorting bar 159 between adjacent data lines 171 into two or more portions. That is, when the contact holes are formed by forming two or more contact holes 189 in the passivation layer 180 between adjacent data lines 171, island-shaped shorting bars 159-1, which do not overlap the data line 171, may be formed between the cut shorting bars 159. As illustrated in FIG. 8, two island-shaped shorting bars are formed; however, any suitable number of island-shaped shorting bars 159-1 may be formed. As seen in FIG. 8, a structure of the cut shorting bars 159 may be formed by forming three contact holes 189 in the passivation layer 180.

It is also contemplated that the shorting bar 159 may be etched via a separate etching process in order to cut the shorting bar 159.

An exemplary thin film transistor array panel, and a manufacturing method thereof, will now be described in association with a liquid crystal display implementation including a pixel electrode and a common electrode formed as part of the thin film transistor array panel. A portion of the cut shorting bar 159 of the thin film transistor array panel will be mainly described with reference to FIGS. 9 and 10. A method of manufacturing the thin film transistor array panel will be described in association with FIGS. 11-18.

Figure 9:
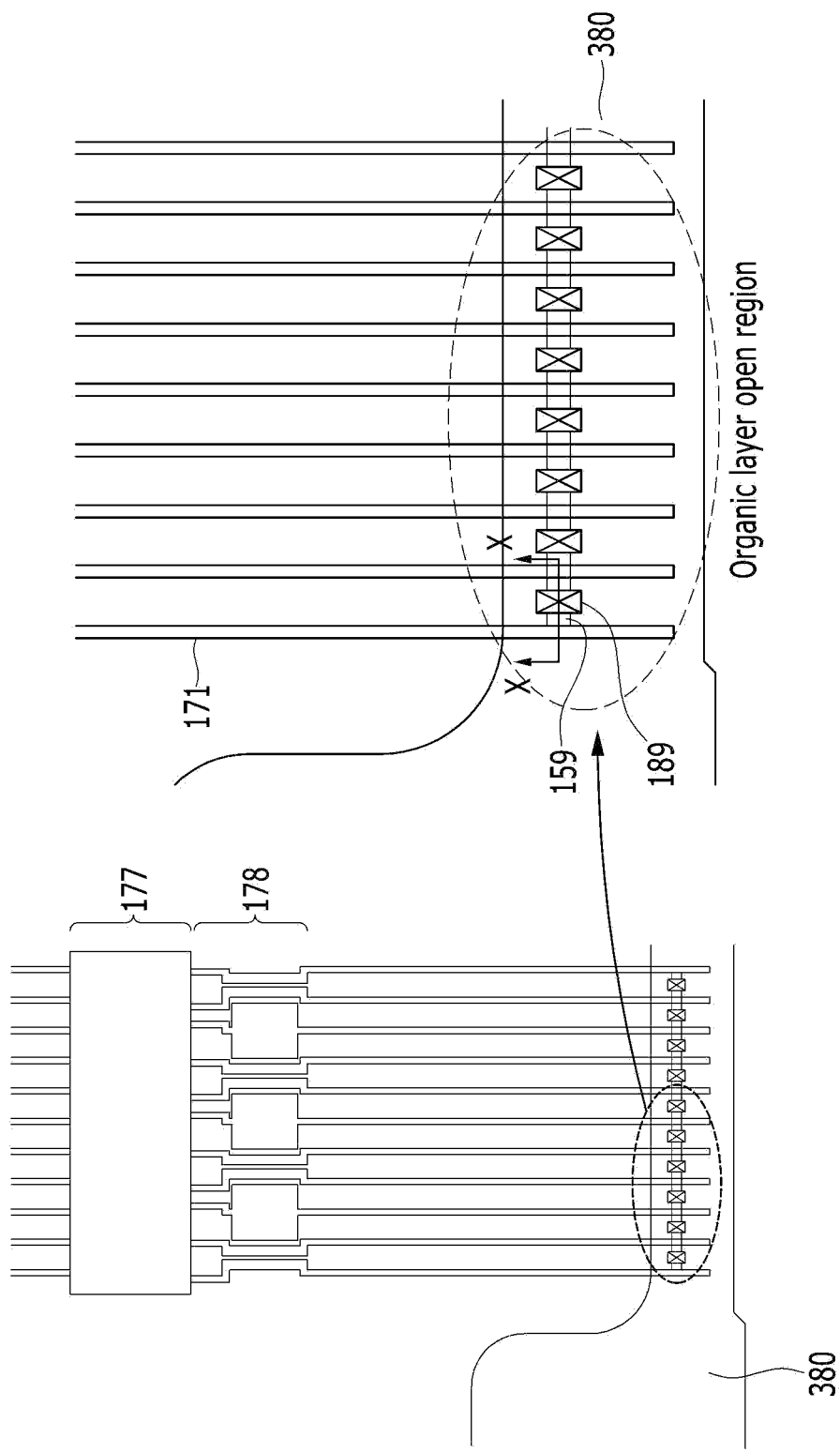
FIG. 9 is an enlarged layout view of a partial region of a thin film transistor array panel, according to exemplary embodiments.
Figure 10:
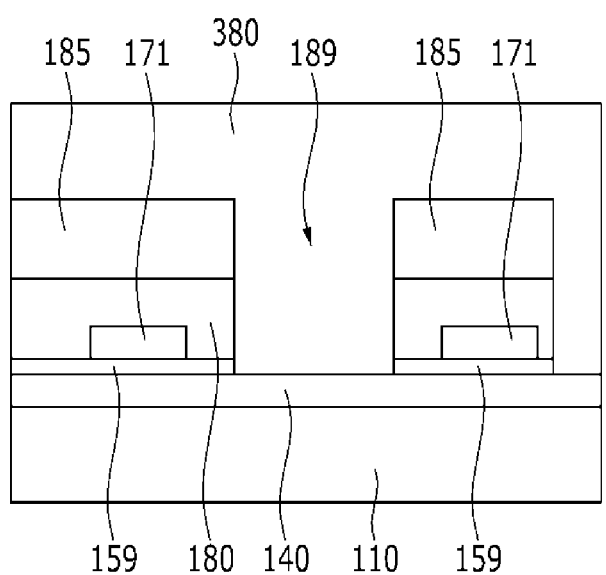
FIG. 10 is a cross-sectional view of the partial region of the thin film transistor array panel of FIG. 9 taken along sectional line X-X, according to exemplary embodiments.

FIG. 9 is an enlarged layout view of a partial region of a thin film transistor array panel, according to exemplary embodiments. FIG. 10 is a cross-sectional view of the partial region of the thin film transistor array panel of FIG. 9 taken along sectional line X-X.

FIG. 9 illustrates a portion of a thin film transistor array panel disposed at an end of a data line 171 opposite of an end at which data pads configured to apply a data voltage to the data line 171 may be disposed. The illustrated portion may include a repair portion 177 in which repair wiring may be formed, an OS pad portion 178 to facilitate OS testing, and a cut shorting bar 159. The repair portion 177 may be disposed between the opposite-end portion of the data line 171 including the data pads and the OS pad portion 178. The OS pad portion 178 may be disposed between the repair portion 177 and the cut shorting bar 159.

According to exemplary embodiments, the repair portion 177 may not be directly connected with the data lines 171. To this end, the repair portion 177 may include a structure that may be connected to a data line 171 when a repair is to be performed with the data line 171. It is also contemplated that a static electricity preventing portion may be provided instead of (or in addition to) the repair portion 177. For instance, the static electricity preventing portion may be disposed at a position where the repair portion 177 is disposed. The static electricity preventing portion may include a thin film transistor and one or more structures configured to safely discharge static electricity from the thin film transistor array panel, e.g., to an outside of the thin film transistor array panel of FIG. 9.

The OS pad portion 178 may include a plurality of OS pads connected to respective data lines 171. A width of the data line 171 may be increased to form an OS pad. The OS pad portion 178 may be utilized to determine whether a data line 171 includes a short-circuit with an adjacent data line or the data line 171 includes an open-circuit. It is noted that OS testing via the OS pads may be performed by applying a voltage to respective OS pads after the data lines 171 have been formed.

A plurality of shorting bars 159 may be arranged in a first (e.g., horizontal) direction, which may be perpendicular (or substantially perpendicular) to a second (e.g., vertical) direction in which the data lines 171 longitudinally extend. The shorting bars 159 may be disposed between the OS pad portion 178 and the peripheral portion of a display area of the thin film transistor array panel. In this manner, the shorting bars 159 may overlap the seal member 380.

The shorting bars 159 may be formed of a semiconductor material, which is a different material than used to form the data lines 171. The shorting bars 159 serve to transfer static electricity from the data lines 171 when the shorting bars 159 are in contact with the data lines 171. It is noted that the shorting bars 159 are not disconnected from the data lines 171 before the completion of the data lines 171 so that the generated static electricity may be removed from the data lines 171. When the data lines 171 are complete, the shorting bars 159 are disconnected. After the shorting bars 159 are disconnected, the OS test may be performed using the OS pad portion 178 using various different data voltages.

According to exemplary embodiments, the shorting bars 159 may be disconnected when the shorting bar 159 is etched to form the contact holes 189 in the passivation layers 180 and 185 covering the data lines 171. This etching process disconnects the shorting bars 159 from one another, and, thereby, disconnects the shorting bars 159 from the data lines 171. Further, the shorting bars 159 may overlap a portion of the seal member 380 to decrease the width of an external peripheral area of the display area DA.

Referring to FIG. 10, the gate insulating layer 140 may be disposed on the insulating substrate 110, the shorting bars 159 may be disposed on the gate insulating layer 140, and the data lines 171 may be respectively disposed on the shorting bars 159. The data lines 171 and the shorting bars 159 may be covered by the passivation layers 180 and 185. The contact hole 189 may be formed in the passivation layers 180 and 185. The contact hole 189 may be positioned so that a cut surface of the shorting bar 159 is exposed to an interior region of the contact hole 189. In other words, the cut surface of the shorting bar 159 may form a portion of the interior surface of the contact hole 189. The contact hole 189 may be filled by the seal member 380, which may be further disposed on the passivation layer 185. In this manner, the shorting bars 159 may be referred to as cut shorting bars 159.

A method of manufacturing the cut shorting bars 159 will be described with reference to FIGS. 11 to 18. In addition to the process of manufacturing and cutting the shorting bar 159, a process of forming a thin film transistor, a pixel electrode 191, and a common electrode 270 in a liquid crystal display panel will also be described.

FIGS. 11 to 18 are respective cross-sectional views of a display area and a peripheral area of the thin film transistor array panel of FIG. 10 at various stages of manufacture, according to exemplary embodiments. In FIGS. 11 to 18, a left side of the cross-sectional view illustrates a pixel within the display area DA and a right side of the cross-sectional view illustrates a region to include a shorting bar to be formed in the peripheral area.

Figure 11:
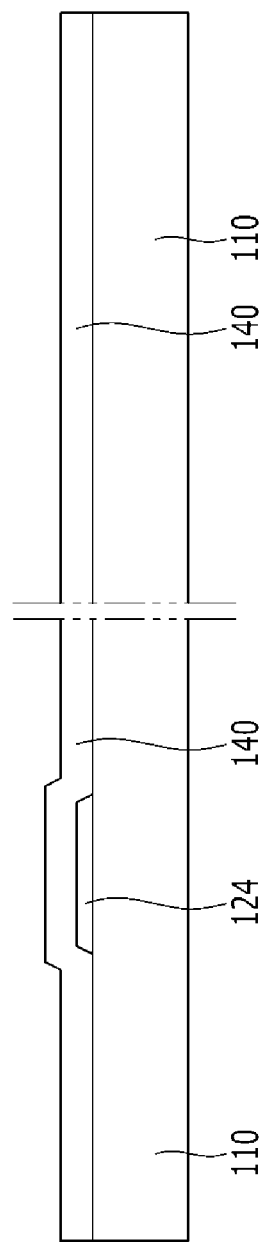
FIGS. 11 to 18 are respective cross-sectional views of a display area and a peripheral area of the thin film transistor array panel of FIG. 10 at various stages of manufacture, according to exemplary embodiments.

As illustrated in FIG. 11, the gate line including the gate electrode 124 may be formed by forming a metal for the gate line on the insulating substrate 110 in the display area and etching the metal disposed on the insulating substrate 110 to pattern the gate line 121 including the gate electrodes 124. The gate insulating layer 140 may be formed to cover the gate lines 121 including the gate electrodes 124. It is noted that the metal for the gate lines 121 may be formed and then completely removed in the shorting bar forming region of the peripheral area. To this end, the gate insulating layer 140 is formed on the insulating substrate 110.

Figure 12:
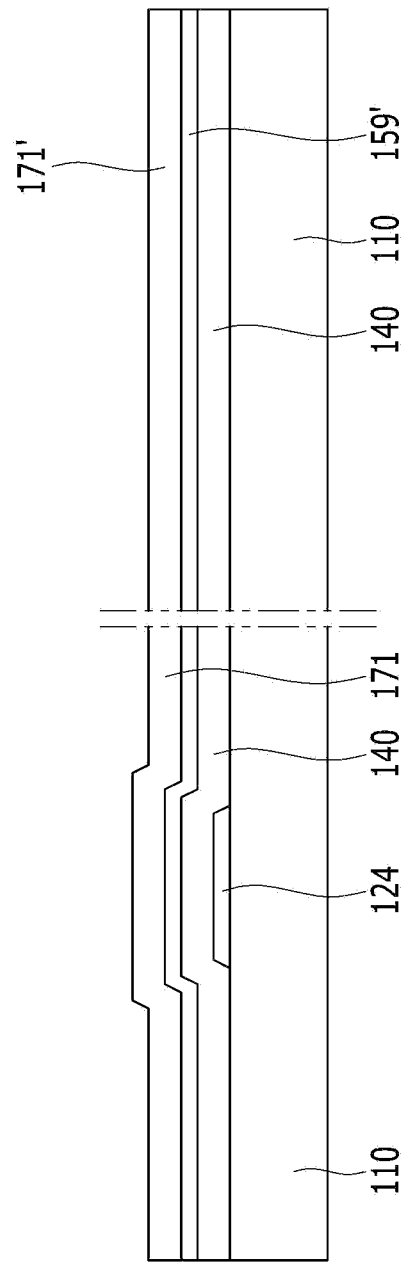

Referring to FIG. 12, the semiconductor material 159' and the material 171' for the data lines 171 are formed on the gate insulating layer 140. That is, the semiconductor material 159' is formed on the gate insulating layer 140 and the material 171' for the data lines 171 is formed on the semiconductor material 159'. When the data lines 171 are formed as single layer structures, the material 171' for the data lines 171 is formed as one layer. When, however, the data lines 171 are formed as multilayer structures, the material 171' for the data lines 171 may be formed as more than one layer. The semiconductor material 159' may be any suitable oxide semiconductor material, such as, for example, amorphous silicon, IGZO, etc. Although not illustrated, a material for an ohmic contact layer may be formed between the material 171' for the data lines 171 and the semiconductor material 159'. In a case where the material for the ohmic contact layer is formed, the material for the ohmic contact layer may be etched in the same pattern as that of the material 171' for the data lines 171.

Figure 13:
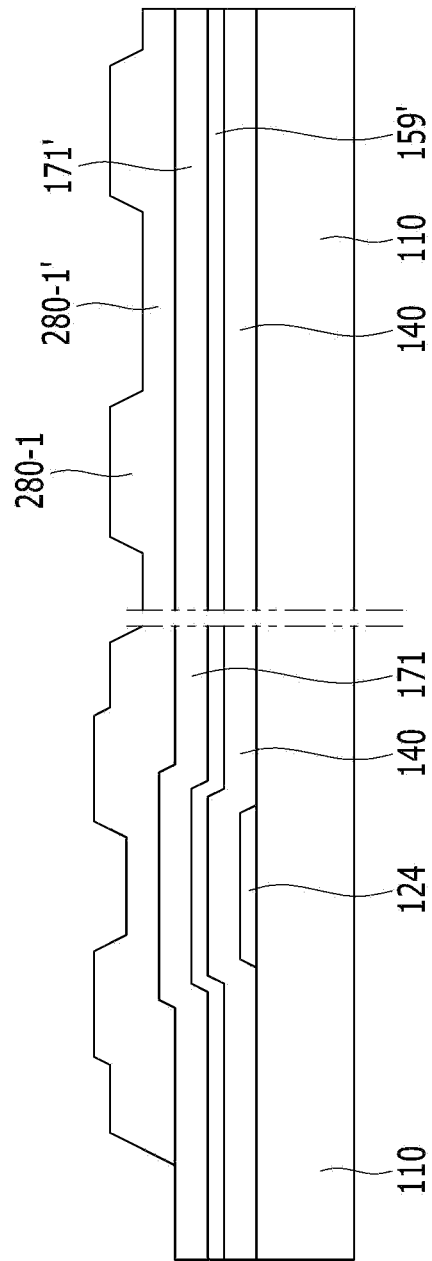

Adverting to FIG. 13, a photoresist is formed on the material 171' for the data lines 171, and the photoresist is exposed using a mask (not illustrated) to form the photoresist patterns 280-1 and 280-1'. The photoresist (or the photoresist patterns 280-1 and 280-1') may be removed in one or more regions. The first region/pattern 280-1' may be formed with a relatively smaller thickness and the second region/pattern 280-1 may be formed with a relatively larger thickness. The region in which the photoresist is removed may correspond to a position at which both the material 171' for the data lines 171 and the semiconductor material 159' are to be removed. The first region 280-1' formed with the relatively smaller thickness corresponds to a position at which the material 171' for the data line is to be removed, but the semiconductor material 159' is to remain. The second region 280-1 formed with the relatively larger thickness corresponds to a position at which the material 171' for the data lines 171 and the semiconductor material 159' is to remain. It is noted that the data line 171, the data pad, the source electrode 173, and the drain electrode 175 are to be formed in the display area where the material 171' for the data lines 171 remains. The shorting bar 159 is to be formed where the material 171' for the data lines 171 remains in the illustrated portion of the peripheral region. To this end, the semiconductor material 159' remains under those positions in which the material 171' for the data lines 171 remains.

According to exemplary embodiments, the position in the display area where the material 171' for the data lines 171 is to be removed, but the semiconductor material 159' is to remain may be formed into a channel region (e.g., a space between a source electrode and a drain electrode) of the thin film transistor, and the position in the peripheral region at which the material 171' for the data lines 171 is to be removed, but the semiconductor material 159' is to remain, corresponds to a position at which the shorting bar 159 is to be formed.

Figure 14:
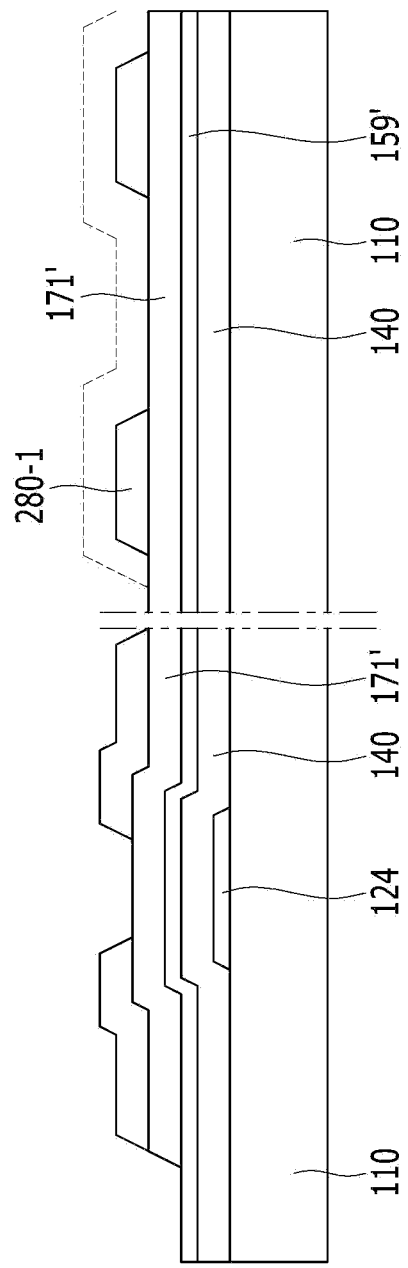

As illustrated in FIG. 14, the material 171' for the data line or the semiconductor material 159' is etched using the photoresist patterns 280-1 and 280-1' as a mask until the first region 280-1' among the photoresist patterns is removed. In this manner, the material 171' for the data lines 171 or the semiconductor material 159' in the region in which the photoresist pattern is not formed is etched, e.g., a region in the display area.

Figure 15:
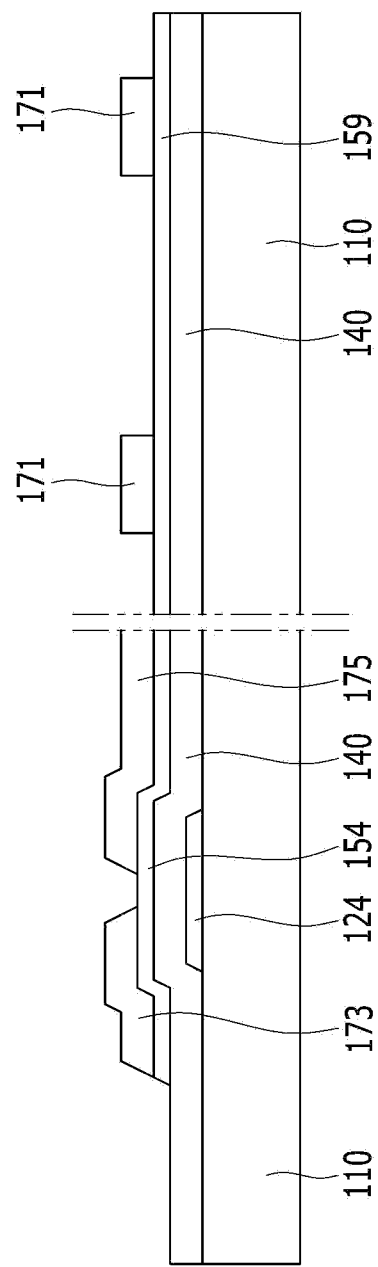

Referring to FIG. 15, the semiconductor material 159' is removed in the region in which the photoresist patterns 280-1 and 280-1' are not formed, and the material 171' for the data lines 171 positioned in the first region 280-1' in the photoresist pattern is removed by etching in the step of FIG. 14. The material 171' for the data lines 171 positioned in the second region 280-1 in the photoresist pattern is not etched to form the data lines 171. The gate insulating layer 140 may also be partially etched in the region in which the photoresist patterns 280-1 and 280-1' are not formed.

When the etching is performed up to FIG. 15, the data line 171, the data pad, the source electrode 173, and the drain electrode 175 are formed. The semiconductor material 159' is left under the data line 171, the data pad, the source electrode 173, and the drain electrode 175. An exposed semiconductor layer 154 is positioned between the source electrode 173 and the drain electrode 175. The exposed semiconductor layer 154 forms the channel of the thin film transistor.

According to exemplary embodiments, the structure where the data line 171 is extended in the peripheral area corresponds to the shorting bar 159 extended in the first (e.g., horizontal) direction that is perpendicular (or substantially perpendicular) to the direction in which the data lines 171 longitudinally extended. In this manner, the shorting bar 159 is formed in the peripheral area. The shorting bar 159 connects the plurality of data lines 171 together. Since the shorting bar 159 is formed of the semiconductor material, when a high voltage, such as static electricity, is applied, the voltage may be distributed to adjacent data lines 171 via the shorting bar 159, so that the static electricity is not concentrated in a particular data line 171.

The above-noted etching process is an oxidation reaction in which the data lines 171 formed of metal loses electrons to be ionized. When the data lines 171 have negative static electricity, the oxidation reaction deteriorates and an etching rate is decreased. As a result, a width of the wire of the data lines 171 with negative static electricity may be increased, and, as such, a display defect may be generated due to a difference in resistance with respect to other data lines 171, which may be the result of a short-circuit with an adjacent data line 171 or an increase in the width of the wire of the data line 171. In exemplary embodiments, however, since the shorting bar 159 connects the data lines 171 together while the data lines 171 are being etched, the static electricity is distributed to the shorting bar 159 and throughout the data lines 171. As such, when the static electricity is generated before the etching process or during the etching process of the data lines 171, the data lines 171 do not exhibit negative static electricity or at least are maintained at a relatively same voltage level. As a result, the width of the wires of the data lines 171 may be uniformly formed, and, as such, display quality may be improved.

Figure 16:
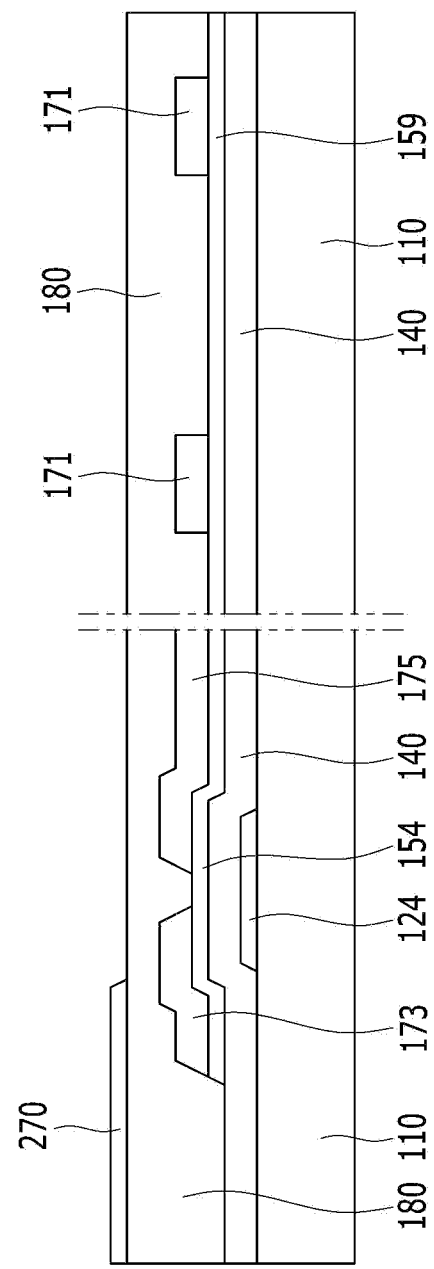

Adverting to FIG. 16, the first passivation layer 180 is formed on the gate insulating layer 140, the source electrode 173, the exposed portion of the semiconductor layer 154, the drain electrode 175, the shorting bar 159, and the data lines 171. A common electrode (e.g., a plate-shaped common electrode) 270 is formed on the first passivation layer 180 in the display area. The common electrode 270 may be formed of any suitable transparent conductive material. It is noted that the transparent conductive material may be formed on the first passivation layer 180 in the peripheral region and then removed when the transparent conductive material is etched to form the common electrode 270.

Figure 17:
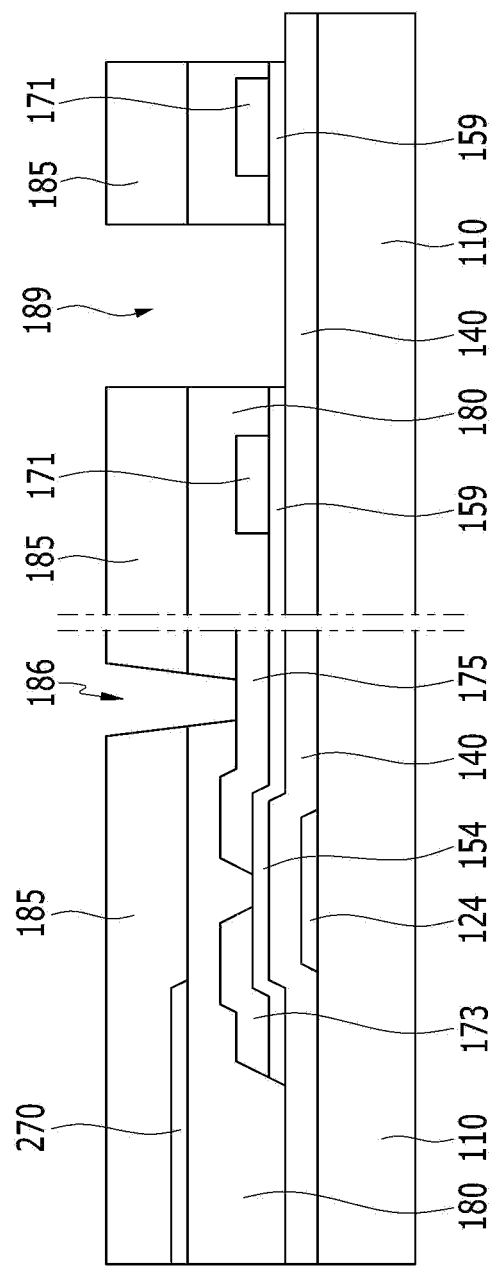

As illustrated in FIG. 17, the second passivation layer 185 is formed to cover the first passivation layer 180 and the common electrode 270. The contact holes 186 and 189 are formed by removing the second passivation layer 185 and the first passivation layer 180. In the display area, the passivation layers 180 and 185 are etched in order to form the first contact hole 186 through which a part of the drain electrode 175 is exposed. In the shorting bar forming region, the shorting bar 159, which is exposed when the second contact hole 189 is formed in the passivation layers 180 and 185, is also etched to remove portions of the shorting bar 159. As a result, the cut shorting bar 159 is formed. Since the cut shorting bar 159 is cut when the second contact hole 189 is formed, an internal surface of the second contact hole 189 and the cut surface of the shorting bar 159 may correspond to each other.

Figure 18:
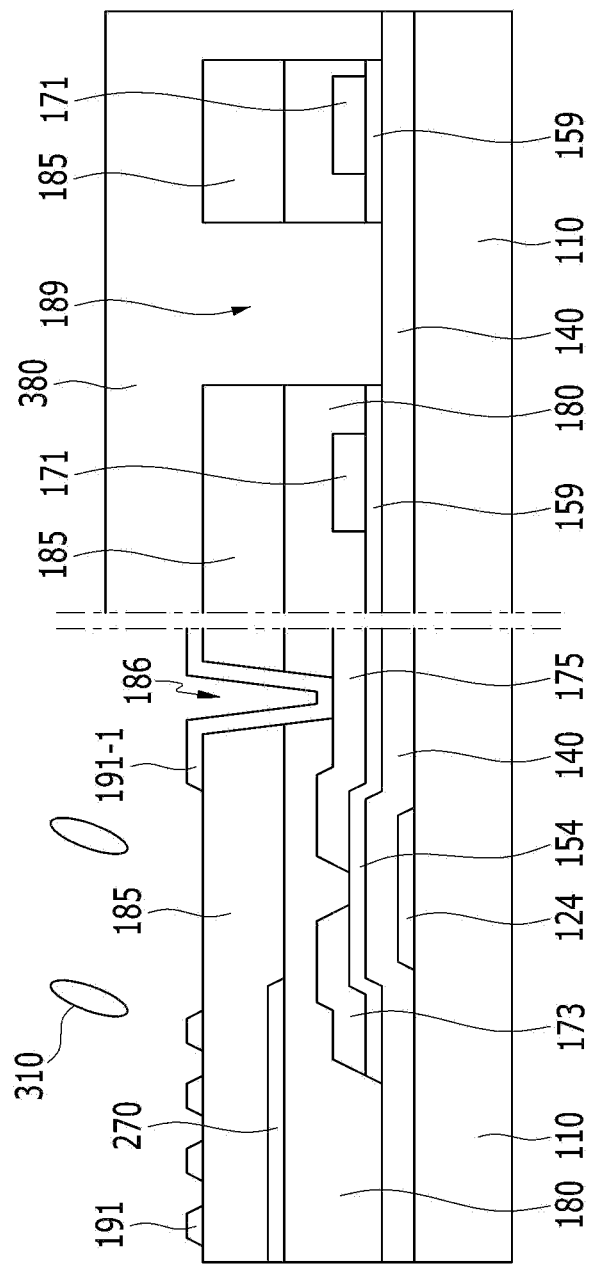

Referring to FIG. 18, in the display area, the pixel electrode 191 and a portion 191-1 connecting the pixel electrode 191 and the drain electrode are formed on the second passivation layer 185. The pixel electrode 191 may be formed of any suitable transparent conductive material. In the shorting bar forming region, a material for the pixel electrode may be formed and removed when the pixel electrode 191 is patterned, e.g., etched. It is noted that FIG. 18 illustrates a part of a structure in which the seal member 380 is formed on the shorting bar forming region. The portion include the seal member 380 may be coupled with an upper display panel (not illustrated). FIG. 18 also illustrates a liquid crystal layer including liquid crystal molecules 310 disposed in the display area. Although not illustrated, the upper display panel may include a color filter and/or a light blocking member.

According to exemplary embodiments, the shorting bar 159 may be formed when the contact hole 189 is formed in the passivation layers 180 and 185 as illustrated in FIG. 17. It is noted, however, that the step of forming the cut shorting bar 159 may also be performed in another step. For example, the shorting bar 159 may be formed of a semiconductor oxide, such as IGZO, and, thereby, may not be etched when the contact hole 189 is formed. As such, the shorting bar 159 may be etched when the pixel electrode 191 is formed, e.g., wet-etched. That is, the shorting bar 159 exposed by the contact hole 189 may be wet-etched by an etchant for the pixel electrode 191. In this manner, the cut surface of the shorting bar 159 formed as a result of the wet-etching may be positioned inwardly from a border of the contact hole 189, which may be caused by an undercut formed via the wet-etchant.

Figure 19:
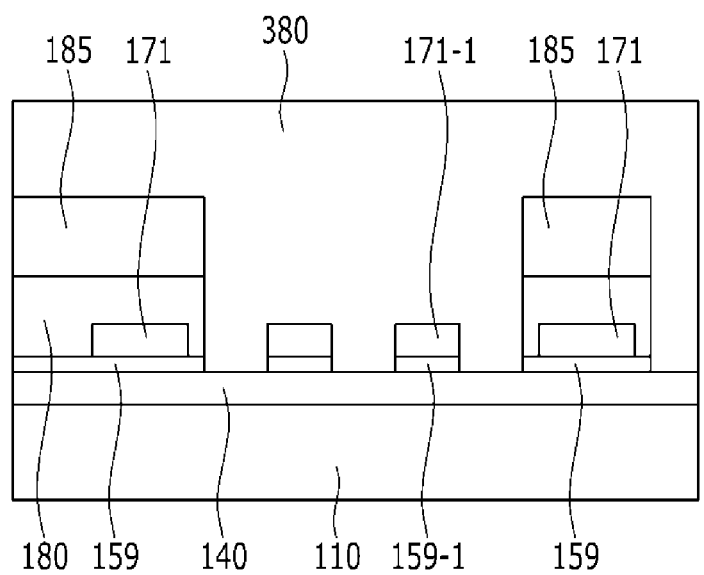
FIG. 19 is a cross-sectional view of a thin film transistor array panel, according to exemplary embodiments.

FIG. 19 is a cross-sectional view of a thin film transistor array panel, according to exemplary embodiments.

As seen in FIG. 19, a structure in which a shorting bar 159 is cut into two or more island-shaped shorting bar portions between adjacent data lines 171 is illustrated. That is, one or more island-shaped shorting bars 159-1, which do not overlap the data lines 171, may be formed between the cut shorting bars 159 upon which the data lines 171 are disposed. The island-shaped shorting bars 159-1 may be formed by forming two or more second contact holes 189 in the passivation layers 180 and 185 between adjacent data lines 171. It is noted that material 171-1 of the data lines 171 may remain on a surface of the island-shaped shorting bars 159-1, which is illustrated in FIG. 19. It is noted that FIG. 19 further illustrates an example in which three second contact holes 189 are formed in the passivation layers 180 and 185. In addition, depending on how the shorting bar 159 is cut, the shorting bar 159 may be wet-etched via a separate etching process. In this manner, the cut surface of the shorting bar 159 formed as a result of the wet-etching may be positioned inwardly from a border of the contact hole 189, which may be caused by an undercut formed via the wet-etchant. To this end, the cut surfaces of the island-shaped shorting bars 159-1 may also be undercut.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. A thin film transistor array panel, comprising:
   a substrate;
   gate lines disposed on the substrate;

data lines disposed on the substrate, the data lines being insulated from and crossing the gate lines in a display area of the substrate;

thin film transistors, each thin film transistor of the thin film transistors being, in the display area, connected to a gate line of the gate lines and a data line of the data lines; and shorting bars disposed on the substrate and outside of the display area, wherein:
the shorting bars comprise a semiconductor material;
portions of the data lines disposed outside of the display area respectively overlap the shorting bars, the shorting bars being disposed between the portions of the data lines and the substrate;
the thin film transistors comprise a semiconductor material; and
the semiconductor material of the thin film transistors and the semiconductor material of the shorting bars are disposed in the same layer.

2. The thin film transistor array panel of claim 1, wherein:
the data lines extend in a first direction; and
the shorting bars extend in a second direction crossing the first direction.

3. The thin film transistor array panel of claim 2, further comprising:
at least one island-shaped shorting bar disposed between adjacent ones of the data lines.

4. The thin film transistor array panel of claim 1, further comprising:
a seal member,
wherein the shorting bars overlap respective portions of the seal member.

5. The thin film transistor array panel of claim 1, further comprising:
a test pad portion disposed between the shorting bars and the display area.

6. The thin film transistor array panel of claim 1, further comprising:
a passivation layer disposed on the data lines and the shorting bars, the passivation layer comprising at least one contact hole formed therein,
wherein an inner surface of the at least one contact hole exposes surfaces of adjacent shorting bars of the shorting bars, the surfaces facing one another.

7. The thin film transistor array panel of claim 6, further comprising:
a common electrode disposed in the display area; and
a pixel electrode disposed in the display area.

8. The thin film transistor array panel of claim 7, wherein:
the passivation layer comprises a first passivation layer and a second passivation layer;
the common electrode is disposed between the first passivation layer and the second passivation layer;
the pixel electrode is disposed on the second passivation layer; and
the contact hole extends through the first passivation layer and the second passivation layer.

9. The thin film transistor array panel of claim 1, wherein the shorting bars are formed of an oxide semiconductor material.

10. The thin film transistor array panel of claim 9, wherein the oxide semiconductor material comprises amorphous silicon or indium gallium zinc oxide.

11. A display device, comprising:
a substrate;
a gate line disposed on the substrate;
a data line disposed on the substrate, insulated from the gate line, and crossing the gate line, the data line comprising:
a first end portion comprising a data pad; and
a second end portion disposed on an island of semiconductor material defining a portion of a shorting bar formed of the semiconductor material, the island of semiconductor material being disposed between the data line and the substrate; and
a pixel comprising a thin film transistor connected to the gate line and the data line, the pixel being configured to display an image in response to signals received via the gate line and the data line,
wherein:
the portion of the shorting bar is electrically connected directly to the data line;
the thin film transistor comprises a semiconductor material; and
the semiconductor material of the thin film transistor and the island of semiconductor material are disposed in the same layer.

* * * * *